(12) United States Patent
Li et al.

(10) Patent No.: US 12,113,576 B2
(45) Date of Patent: Oct. 8, 2024

(54) TRANSMITTER CIRCUIT, OPTICAL MODULE, AND COMMUNICATIONS DEVICE

(71) Applicant: Huawei Technologies Co., Ltd., Shenzhen (CN)

(72) Inventors: Zhiwei Li, Wuhan (CN); Zhongzhi Shang, Shenzhen (CN); Wenjun Shi, Wuhan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 65 days.

(21) Appl. No.: 18/070,126

(22) Filed: Nov. 28, 2022

(65) Prior Publication Data

US 2023/0113709 A1    Apr. 13, 2023

Related U.S. Application Data

(63) Continuation of application No. PCT/CN2021/093448, filed on May 12, 2021.

(30) Foreign Application Priority Data

May 29, 2020 (CN) .......................... 202010477470.2

(51) Int. Cl.
*H04B 10/50* (2013.01)
*H01S 5/042* (2006.01)
*H04B 10/40* (2013.01)

(52) U.S. Cl.
CPC ........... *H04B 10/504* (2013.01); *H01S 5/042* (2013.01); *H04B 10/40* (2013.01)

(58) Field of Classification Search
CPC ........ H04B 10/504; H04B 10/40; H01S 5/042
(Continued)

(56) References Cited

U.S. PATENT DOCUMENTS 6,941,080 B2 * 9/2005 Kasper ................. H04B 10/504
398/186
2013/0308669 A1 * 11/2013 Nogami ................. H01S 5/0085
372/38.07

(Continued)

FOREIGN PATENT DOCUMENTS

| CN | 104767117 B | * | 2/2018 | |
| CN | 108923248 A | * | 11/2018 | ............. H01S 5/042 |
| JP | 2018186112 A | * | 11/2018 | |

OTHER PUBLICATIONS

Chen et al; Modulated High Power and Narrow Pulse Width Laser Drive Circuit for Lidar System; Mar. 2021; MDPI; pp. 1-15. (Year: 2021).*

*Primary Examiner* — Amritbir K Sandhu
(74) *Attorney, Agent, or Firm* — Slater Matsil, LLP

(57) ABSTRACT

A transmitter circuit, an optical module, and a communications device is disclosed. A transmitter circuit includes a driver and a directly modulated laser DML. A positive electrode of the driver is connected to a positive electrode of the DML, a negative electrode of the DML is connected to a voltage terminal, and the negative electrode of the DML is connected to a ground terminal through a capacitor. The driver is configured to generate a drive current based on an input signal, and output the drive current to the DML through the positive electrode of the driver. The DML inputs a first part of current of the drive current to the ground terminal through the capacitor, and the DML inputs a second part of current of the drive current to the voltage terminal.

20 Claims, 7 Drawing Sheets

(58) Field of Classification Search
USPC .......................................................... 398/197
See application file for complete search history.

(56) References Cited

U.S. PATENT DOCUMENTS

| | | | |
|---|---|---|---|
| 2014/0233594 A1* | 8/2014 | Kubo | H01S 5/0428 |
| | | | 372/29.012 |
| 2020/0029385 A1* | 1/2020 | Bergstr?m | H04W 72/21 |
| 2020/0029835 A1* | 1/2020 | Tang | A61B 5/6832 |
| 2020/0059385 A1 | 2/2020 | Hu et al. | |

* cited by examiner

TRANSMITTER CIRCUIT, OPTICAL MODULE, AND COMMUNICATIONS DEVICE

CROSS-REFERENCE TO RELATED APPLICATIONS

This application is a continuation of International Application No. PCT/CN2021/093448, filed on May 12, 2021, which claims priority to Chinese Patent Application No. 202010477470.2, filed on May 29, 2020. The disclosures of the aforementioned applications are hereby incorporated by reference in their entireties.

TECHNICAL FIELD

This application relates to the field of optical communications technologies, and in particular, to a transmitter circuit, an optical module, and a communications device.

BACKGROUND

In modern optical communications networks, a directly modulated laser (DML) has a simpler structure, lower costs, and less power consumption than an electro-absorption modulator (EAM) and a Mach-Zehnder modulator (MZM), and therefore is widely used. The DML is driven by a current to emit light. The DML is modulated by modulating a current passing through the DML, so that output optical power of the DML changes with a modulated signal, to convert an electrical signal into an optical signal. Two currents, namely, a bias current $I_{bias}$ and a modulated current $I_{mod}$, need to be input so that the DML can work normally and generate a modulated optical signal.

Currently, a DML driver is widely used in optical signal transmitter circuits to drive DMLs. In a transmitter circuit, as shown in FIG. 1, a DML and a driver are connected in series. A positive electrode (also referred to as a positive pole, P) of the DML implements radio frequency grounding, and a negative electrode (also referred to as a negative pole, N) of the DML is connected to a negative electrode (−) of the driver, a positive electrode (+) of the driver is connected to the positive electrode P of the DML, and a capacitor C is connected between a ground terminal GND and the positive electrode P of the DML to implement radio frequency grounding. In this way, an input signal is converted into a driver current $I_{driver}$ by the driver to modulate a working current $I_{laser}$ of the DML, $I_{laser}$ fully falls, flows, or is absorbed into the driver, and $I_{driver}$ is equal to $I_{laser}$.

The positive electrode P of the DML needs to be connected to the capacitor C. Therefore, in a package structure of the circuit shown in FIG. 1, because the DML generally has the positive electrode P on an upper surface and the negative electrode N on a lower surface, when the positive electrode P of the DML is connected to the capacitor C, only a wire bonding (wire bonding, or referred to as wire seating) manner can be used. In addition, wire bonding is also required between the positive electrode P of the DML and the positive electrode (+) of the driver, and between the negative electrode N of the DML and the negative electrode (−) of the driver. However, a modulated current $I_{mod}$ is usually an alternating current signal. When the current flows through a bonding wire, parasitic inductance is introduced due to wire bonding connection, which greatly affects an overall package bandwidth, and limits overall component performance improvement.

SUMMARY

Embodiments of this application provide a transmitter circuit, an optical module, and a communications device, to improve overall component bandwidth performance.

According to a first aspect, a transmitter circuit is provided. The transmitter circuit includes a driver and a directly modulated laser DML. The driver and the directly modulated laser DML are connected in series. For example, a positive electrode of the driver is connected to a positive electrode of the DML, a negative electrode of the DML is connected to a voltage terminal, and the negative electrode of the DML is connected to a ground terminal through a capacitor. The driver is configured to generate a drive current based on an input signal, and output the drive current to the DML through the positive electrode of the driver. The DML inputs a first part of current of the drive current to the ground terminal through the capacitor, and the DML inputs a second part of current of the drive current to the voltage terminal. To drive the DML to work normally and generate a modulated optical signal, generally, the first part of current is a modulated current $I_{mod}$, and the second part of current is a bias current $I_{bias}$. In this way, first, the transmitter circuit provided in the foregoing solution provides a circuit structure in which the driver and the directly modulated laser DML are connected in series, $I_{driver}$ output by the driver entirely passes through the DML, and there is no shunt component in the serially connected circuit structure, thereby reducing power consumption. In addition, because the negative electrode of the DML is directly connected to the ground terminal GND through the capacitor C to implement radio frequency grounding, that is, the first part of current can be introduced into the ground terminal, when a package structure of the transmitter circuit is implemented, wire bonding needs to be performed only on the positive electrode of the driver and the positive electrode of the DML, thereby reducing impact on an overall package bandwidth and improving overall component bandwidth performance.

In a possible design, the positive electrode of the driver and the ground terminal are respectively located on two sides of the driver, and the positive electrode of the driver is connected to the positive electrode of the DML through a first bonding wire. That the positive electrode of the driver and the ground terminal are respectively located on two sides of the driver means that the positive electrode of the driver is located on an upper surface of two opposite surfaces of the driver, and the ground terminal is located on a lower surface of the two opposite surfaces of the driver; or the positive electrode of the driver is located on the lower surface of the two opposite surfaces of the driver, and the ground terminal is located on the upper surface of the two opposite surfaces of the driver. In this way, because the negative electrode of the DML directly implements radio frequency grounding through the capacitor, that is, the first part of current can be introduced into the ground terminal, when a package structure of the transmitter circuit is implemented, wire bonding needs to be performed only on the positive electrode of the driver and the positive electrode of the DML, thereby reducing impact on an overall package bandwidth and improving overall component performance.

In a possible design, the positive electrode of the driver and the ground terminal are located on a same side of the driver, and the positive electrode of the driver extends to a transition layer outside the driver and is connected to the positive electrode of the DML through a first bonding wire. In this way, because the negative electrode of the DML directly implements radio frequency grounding through the capacitor, that is, the first part of current can be introduced into the ground terminal, when a package structure of the transmitter circuit is implemented, wire bonding needs to be performed only on the positive electrode of the driver and the positive electrode of the DML, thereby reducing impact on an overall package bandwidth and improving overall component performance.

In a possible design, the capacitor is a surface mount capacitor, and the surface mount capacitor is soldered between the negative electrode of the DML and the ground terminal. The surface mount capacitor can be directly soldered between the negative electrode of the DML and the ground terminal, thereby avoiding connecting to the capacitor by wire bonding.

In a possible design, the voltage terminal is configured to input a predetermined voltage, and may be connected to an external power supply to provide the predetermined voltage. The predetermined voltage may be a positive voltage, a negative voltage, or a zero voltage. In this way, the negative electrode of the DML is led out to provide any voltage through the voltage terminal, so that configuration can be performed more flexibly. A voltage at the voltage terminal may be zero, that is, the negative electrode of the DML is directly connected to the ground terminal (in this case, a zero voltage is provided). When the voltage terminal provides a negative voltage, a voltage difference between a power supply terminal of the driver and the voltage terminal may be increased, to compensate for a problem that a power supply voltage of the driver may not have a sufficient drive voltage. In addition, the voltage terminal may be the negative electrode of the driver, and the negative electrode of the driver is configured to input the predetermined voltage to the negative electrode of the DML. Alternatively, when the voltage of the voltage terminal may be zero, the voltage terminal may be directly the ground terminal.

In a possible design, the DML is usually configured to convert an electrical signal into an optical signal and transmit the optical signal in a transmission medium (such as an optical fiber). When the optical signal needs to be transmitted in a time division multiplexing manner, enabling and disabling of the optical signal of the DML need to be controlled, for example, an upstream signal in a passive optical network (passive optical network, PON). Therefore, enabling and disabling of signal light of the DML need to be controlled, that is, the driver needs to support a burst function. In this case, the positive electrode of the driver is connected in series to the positive electrode of the DML through a first switch. In this way, when the first switch is turned on, the driver outputs the drive current $I_{driver}$ to the DML through the positive electrode of the driver, to enable the signal light. Alternatively, the negative electrode of the DML is connected in series to the voltage terminal through a second switch. In this way, when the second switch is turned on, the driver outputs the drive current $I_{driver}$ to the DML through the positive electrode of the driver, to enable the signal light.

According to a second aspect, an optical module is provided, including a transmitter circuit and a receiver circuit. The transmitter circuit is the transmitter circuit in the first aspect or any possible design of the first aspect.

According to a third aspect, a communications device is provided, including the optical module provided in the second aspect and a signal source. The signal source is configured to output an input signal to the optical module.

For technical effects brought by any design manner in the second aspect and the third aspect, refer to the technical effects brought by different design manners in the first aspect. Details are not described herein again.

DETAILED DESCRIPTION OF ILLUSTRATIVE EMBODIMENTS

The following describes the technical solutions in embodiments of this application with reference to the accompanying drawings in embodiments of this application. It is clear that the described embodiments are merely a part rather than all of embodiments of this application.

Figure 1:
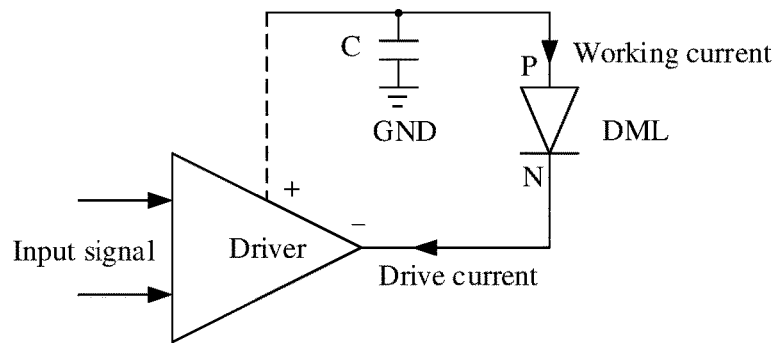
FIG. 1 is a schematic diagram of a structure of a transmitter circuit according to a conventional technology.
Figure 2:
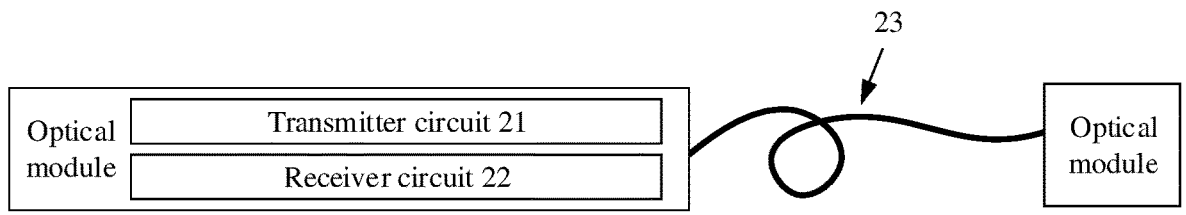
FIG. 2 is a schematic diagram of a structure of an optical module according to an embodiment of this application.

The embodiments of this application are applied to an optical module, and a function of the optical module is optical-to-electrical conversion. The optical module is also referred to as an optical transmission module. Referring to FIG. 2, the optical module includes a transmitter circuit 21 and a receiver circuit 22. A function of the transmitter circuit 21 is to convert an electrical signal into an optical signal, and input the optical signal into an optical fiber 23 for transmission. A function of the receiver circuit 22 is to receive an optical signal transmitted from the optical fiber 23, and convert the optical signal into an electrical signal. The transmitter circuit 21 and the receiver circuit 22 in FIG. 2 may multiplex the optical fiber 23. Certainly, the optical signals of the transmitter circuit 21 and the receiver circuit 22 may alternatively be transmitted in two optical fibers respectively. Generally, an optical module at a transmit end converts an electrical signal into an optical signal. After transmission through an optical fiber, an optical module at a receive end converts the optical signal into an electrical signal.

The optical module is mainly applied to fields such as Ethernet, fiber to the home (FTTH), an optical transport network (OTN), network storage, and a data center. Based on the application fields, the optical module is mainly applied to a device such as an optical line terminal (OLT), an optical network unit (ONU), a switch, an optical fiber router, a video optical transceiver, an optical fiber transceiver, or a fiber Ethernet adapter in the fields. The communications device may further include a signal source, configured to generate an input signal and input the input signal to the optical module. The optical module converts the input signals into an optical signal and transmits the optical signal through an optical fiber. The optical module supports different rate classifications, for example, low rates of 1 G to 10 G, 25 G, 40 G, 50 G, 100 G, and 200 G/400 G.

Figure 3:
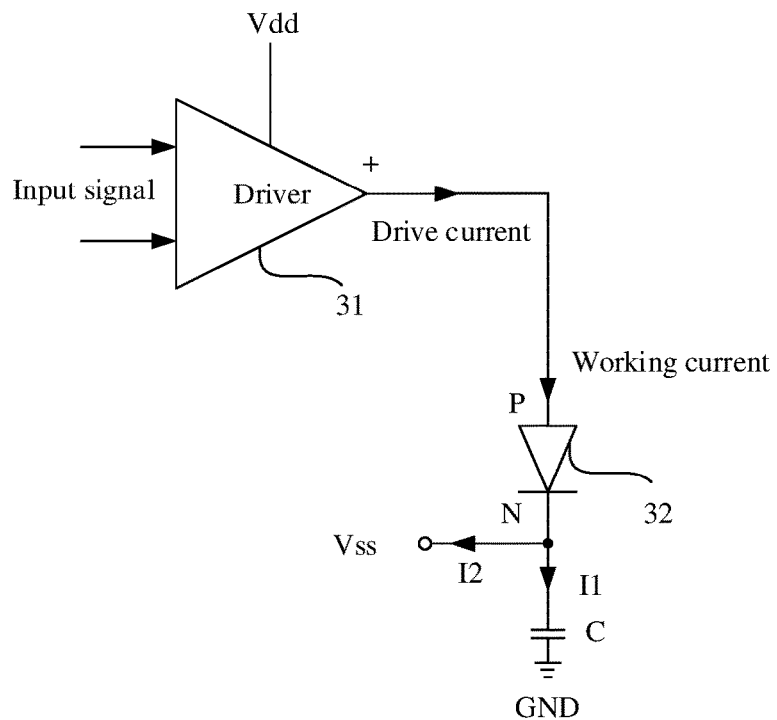
FIG. 3 is a schematic diagram of a structure of a transmitter circuit according to an embodiment of this application.

To convert an electrical signal into an optical signal, an example of this application provides a transmitter circuit. Referring to FIG. 3, the transmitter circuit includes a driver 31 and a directly modulated laser DML 32.

A positive electrode (+) of the driver 31 is connected to a positive electrode P of the DML 32, a negative electrode N of the DML 32 is connected to a voltage terminal Vss, and the negative electrode N of the DML 32 is connected to a ground terminal GND through a capacitor C. The driver 31 is configured to generate a drive current $I_{driver}$ based on an input signal, and output the drive current $I_{driver}$ to the DML 32 through the positive electrode (+) of the driver 31. The DML 32 inputs a first part of current I1 of the drive current $I_{driver}$ to the ground terminal GND through the capacitor C, and the DML 32 inputs a second part of current $I_2$ of the drive current $I_{driver}$ to the voltage terminal Vss.

Figure 4:
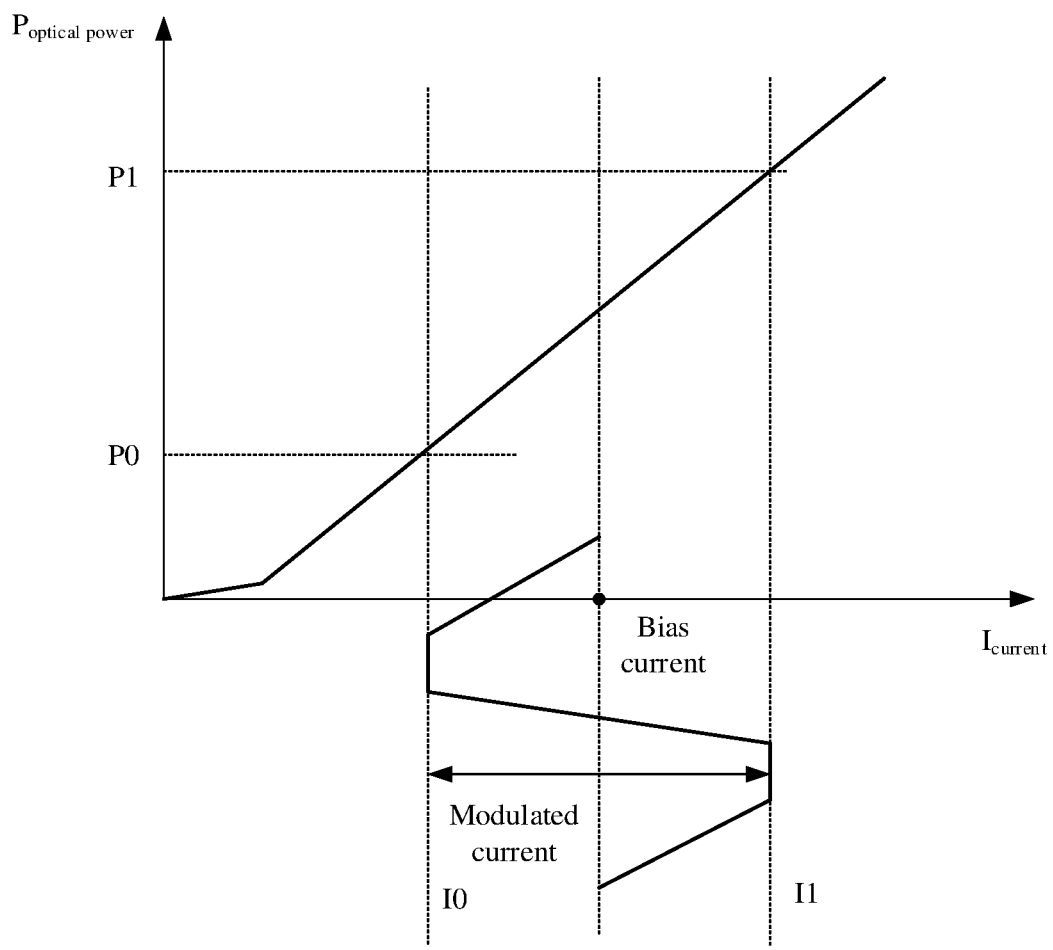
FIG. 4 is a schematic diagram of a working current of a DML according to an embodiment of this application.

In the foregoing solution, the input signal has an alternating current characteristic. For example, the input signal may be a radio frequency (RF) signal. The drive current $I_{driver}$ output by the driver 31 is equal to a working current $I_{laser}$ flowing through the DML. The first part of current $I_1$ is a modulated current $I_{mod}$, and the second part of current $I_2$ is a bias current $I_{bias}$. Generally, two currents, namely, a bias current $I_{bias}$ and a modulated current $I_{mod}$, need to be input so that the DML can work normally and generate a modulated optical signal. $I_{bias}$ is a constant, and $I_{bias}$ enables the DML to work at a normal bias point. Generally, $I_{bias}$ of the DML is 30 to 60 mA (milliamperes). $I_{mod}$ is a modulated current, and is provided by the driver. Generally, $I_{mod}$ is 40 mApp to 60 mApp (current peak to peak, mA peak to peak, mApp for short). For a non-return zero (NRZ) modulation format, a basic principle of DML working is shown in FIG. 4. An actual working current $I_{laser}$ of DML working changes from I0 (I0=$I_{bias}$+$I_{mod}$/2) to I1 (I1=$I_{bias}$–$I_{mod}$/2), and power of a modulated optical signal output by a corresponding DML changes from P0 to P1. In this way, an electrical signal is converted into an optical signal by the DML. A principle of another modulation format such as 4 pulse amplitude modulation (PAM4) is basically the same. FIG. 3 further provides a power supply terminal Vdd of the driver 31, configured to provide a working voltage for the driver 31.

The transmitter circuit provided in the foregoing solution provides a circuit structure in which the driver and the directly modulated laser DML are connected in series, $I_{driver}$ output by the driver entirely passes through the DML, and there is no shunt component in the serially connected circuit structure, thereby reducing power consumption. In addition, because the negative electrode N of the DML is directly connected to the ground terminal GND through the capacitor C to implement radio frequency grounding, that is, $I_{mod}$ can be introduced into the ground terminal GND, when a package structure of the transmitter circuit is implemented, wire bonding needs to be performed only on the positive electrode (+) of the driver and the positive electrode P of the DML, thereby reducing impact on an overall package bandwidth and improving overall component bandwidth performance.

The voltage terminal Vss is configured to input a predetermined voltage, and may be connected to an external power supply to provide the predetermined voltage. The predetermined voltage may be a positive voltage, a negative voltage, or a zero voltage. In this way, the negative electrode N of the DML is led out to provide any voltage through the voltage terminal Vss, so that configuration can be performed more flexibly. A voltage at the voltage terminal Vss may be zero, that is, the negative electrode N of the DML is directly connected to the ground terminal GND (in this case, a zero voltage is provided). When the voltage terminal Vss provides a negative voltage, a voltage difference between Vdd and Vss may be increased, to compensate for a problem of an insufficient drive voltage provided by the power supply terminal of the driver. In addition, the voltage terminal Vss may be the negative electrode of the driver, and the negative electrode of the driver is configured to input the predetermined voltage to the negative electrode of the DML.

The DML is configured to convert an electrical signal into an optical signal and transmit the optical signal in a transmission medium (such as an optical fiber). When the optical signal needs to be transmitted in a time division multiplexing manner, enabling and disabling of the optical signal of the DML need to be controlled. For example, to transmit an upstream signal of an ONU in a PON network, a device needs to be in a disabled state when no signal is sent, and can be quickly enabled or recover a normal signal when a signal arrives, that is, a burst mode. Therefore, enabling and disabling of signal light of the DML need to be controlled, that is, the driver needs to support a burst function. Therefore, an embodiment of this application provides a transmitter circuit shown in FIG. 5. A positive electrode (+) of the driver 31 is connected in series to the positive electrode P of the DML 32 through a first switch K1. In this way, when the first switch K1 is turned on, the driver 31 outputs the drive current $I_{driver}$ to the DML 32 through the positive electrode of the driver, to enable the signal light. Alternatively, a transmitter circuit is provided. As shown in FIG. 6, the negative electrode N of the DML 32 is connected in series to the voltage terminal Vss through a second switch K2. In this way, when the second switch K2 is turned on, the driver 31 outputs the drive current $I_{driver}$ to the DML 32 through the positive electrode (+) of the driver, to enable the signal light. When optical signal transmission is not required, the first switch K1 (or the second switch K2) is controlled to be turned off.

Figure 5:
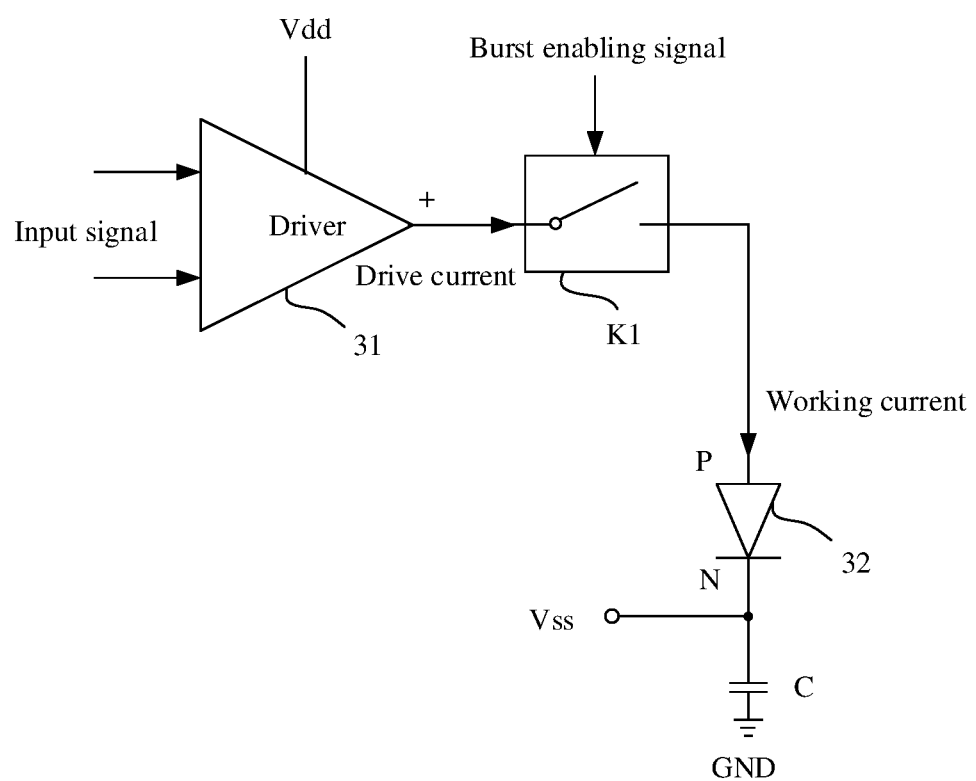
FIG. 5 is a schematic diagram of a structure of a transmitter circuit according to another embodiment of this application.
Figure 6:
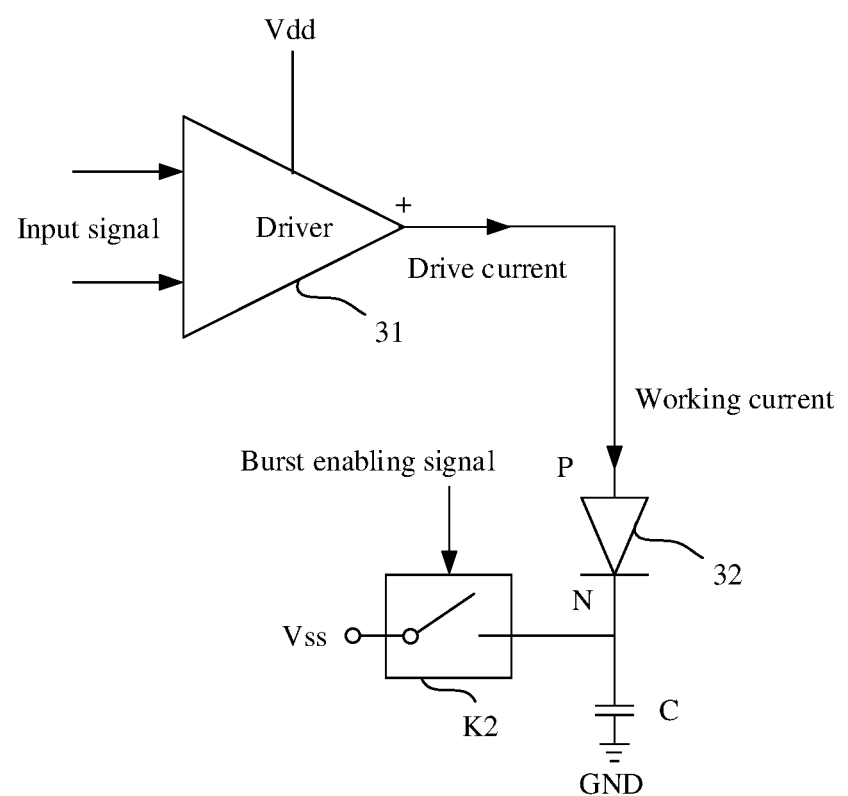
FIG. 6 is a schematic diagram of a structure of a transmitter circuit according to still another embodiment of this application.

FIG. 5 and FIG. 6 each provide a placement position of a burst switch (the first switch K1 or the second switch K2) for controlling the burst function of the driver 31. In this way, the burst switch is controlled by an external input burst enable (BEN) signal to switch to an on or off state, thereby controlling enabling and disabling of the optical signal output by the DML. For example, the burst switch may be implemented by using a transistor such as a field effect transistor (FET), a heterojunction bipolar transistor (HBT), a high electron mobility transistor (HEMT), or a bipolar junction transistor (BJT).

Figure 7:
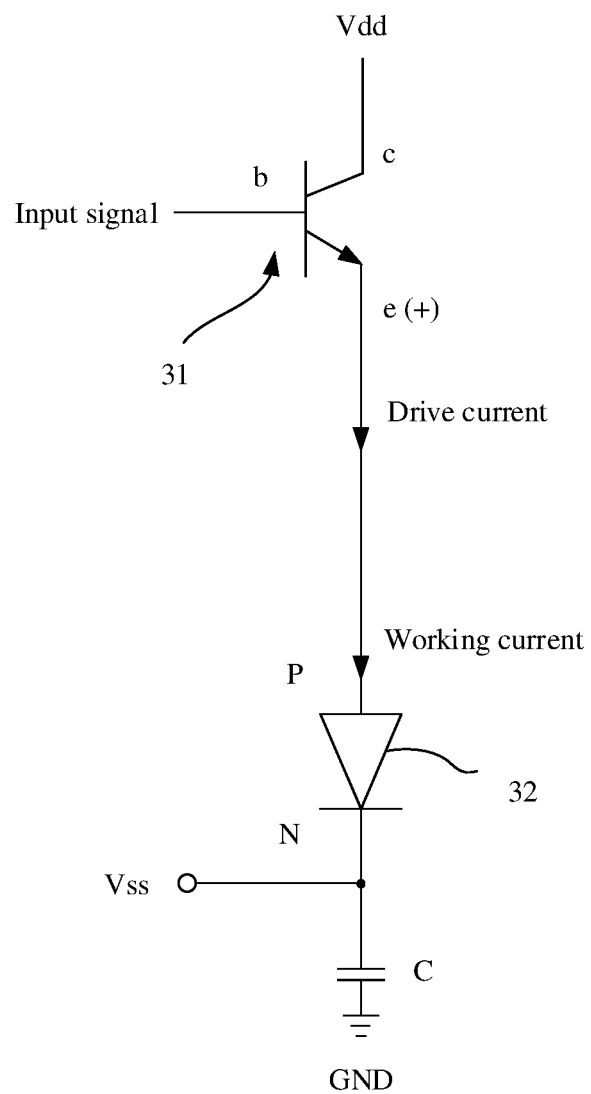
FIG. 7 is a schematic diagram of a structure of a transmitter circuit according to yet another embodiment of this application.

In an example, the driver 31 includes at least one transistor, and the at least one transistor is connected to form a single-ended drive circuit. As shown in FIG. 7, the driver 31 may be one transistor, and the transistor includes an emitter (e), a base (b), and a collector (c). The input signal is input to the base b, the emitter e is connected as the positive electrode (+) of the driver 31 to the positive electrode P of the DML 32, and the collector c is used as the power supply terminal Vdd of the driver 31. The transistor may be implemented by using a transistor such as a FET, an HBT, an HEMT, or a BJT.

Figure 8:
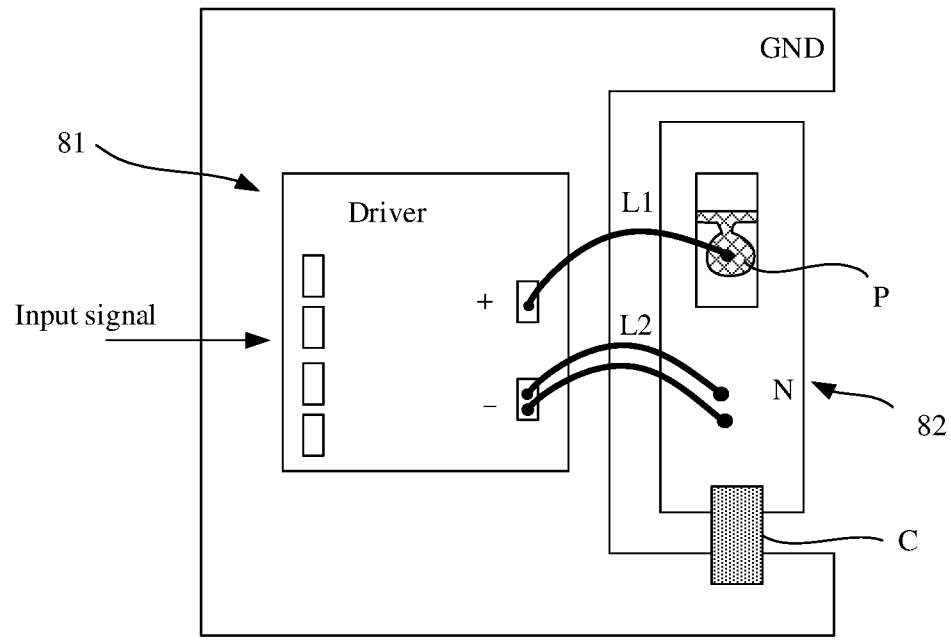
FIG. 8 is a schematic diagram of a package structure of a transmitter circuit according to an embodiment of this application.

With reference to the transmitter circuit provided in FIG. 3, referring to FIG. 8, a package structure of the transmitter circuit is provided. A positive electrode (+) of a driver 81 and a ground terminal GND are respectively located on two sides of the driver 81, the positive electrode (+) of the driver 81 is connected to a positive electrode P of a DML 82 through a first bonding wire L1, and a negative electrode N of the DML 82 is connected to a voltage terminal Vss.

That a positive electrode (+) of a driver 81 and a ground terminal GND are respectively located on two sides of the driver 81 means that the positive electrode (+) of the driver 81 is located on an upper surface of two opposite surfaces of the driver 81, and the ground terminal GND is located on a lower surface of the two opposite surfaces of the driver 81; or the positive electrode (+) of the driver 81 is located on the lower surface of the two opposite surfaces of the driver 81, and the ground terminal GND is located on the upper surface of the two opposite surfaces of the driver 81. In addition, FIG. 8 also shows an electrode on the driver that is located on the same side as the positive electrode (+) and that is configured to input a signal, for example, a signal input electrode such as Vdd. In this way, because the negative electrode N of the DML directly implements radio frequency grounding through a capacitor C, that is, $I_{mod}$ can be introduced into ground, when the package structure of the transmitter circuit is implemented, wire bonding needs to be performed only on the positive electrode (+) of the driver 81 and the positive electrode P of the DML, thereby reducing impact on an overall package bandwidth and improving overall component bandwidth performance.

In addition, the capacitor C may be a surface mount capacitor, and the surface mount capacitor C is soldered between the negative electrode N of the DML 82 and the ground terminal GND. With the use of the surface mount capacitor, the capacitor C can be directly soldered between the negative electrode N of the DML 82 and the ground terminal GND, thereby avoiding connecting to the capacitor C by wire bonding.

In addition, as shown in FIG. 8, when the voltage terminal Vss is the negative electrode (−) of the driver 81, the negative electrode (−) of the driver 81 and the positive electrode (+) of the driver 81 are located on a same side of the driver 81. The negative electrode N of the DML 82 is connected to the negative electrode (−) of the driver 81 through a second bonding wire L2, and the negative electrode (−) of the driver 81 is configured to input a predetermined voltage to the negative electrode N of the DML.

With reference to the transmitter circuit shown in FIG. 5, in the transmitter circuit package structure, the first switch K1 may be included in the driver. In this case, the first switch K1 is connected in series to the positive electrode of the driver 81. When the first switch K1 is turned on, the driver 81 outputs the drive current $I_{driver}$ to the DML 82 through the first switch K1 and the positive electrode (+) of the driver 81.

Figure 9:
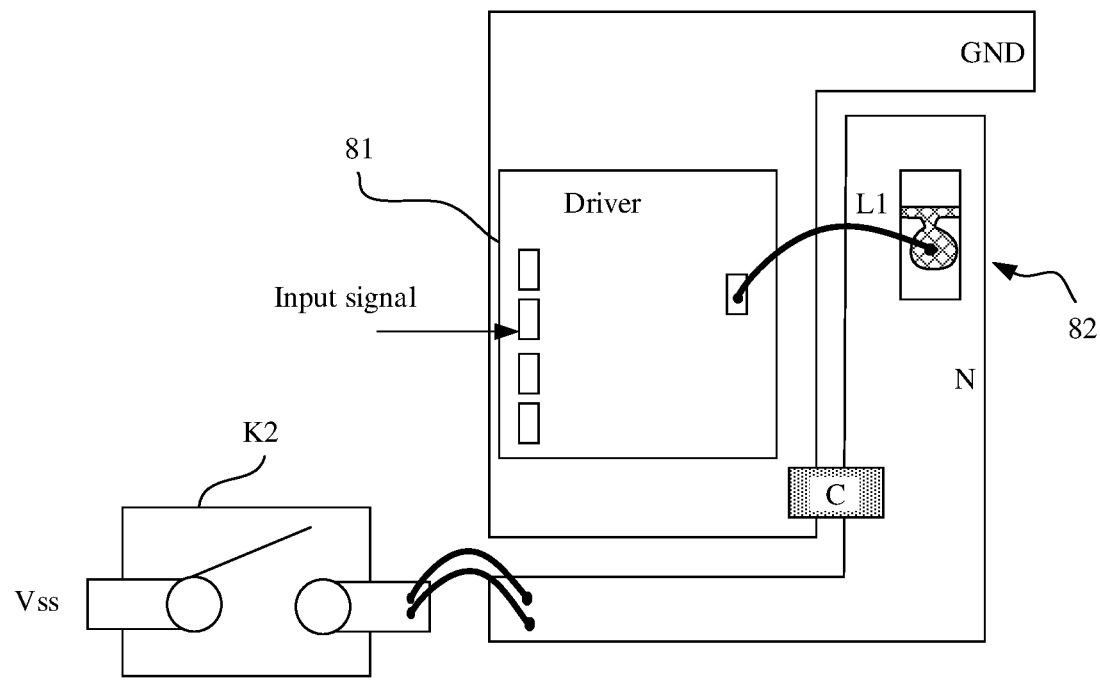
FIG. 9 is a schematic diagram of a package structure of a transmitter circuit according to another embodiment of this application.

With reference to the transmitter circuit shown in FIG. 6, as shown in FIG. 9, the package structure includes the second switch K2, and the second switch K2 is connected in series between the negative electrode N of the DML 82 and the voltage terminal Vss. When the second switch K2 is turned on, the driver 81 outputs the drive current $I_{driver}$ to the DML 82 through the positive electrode (+) of the driver 81. When the voltage terminal Vss is the negative electrode (−) of the driver, the second switch K2 may also be included in the driver.

Figure 10:
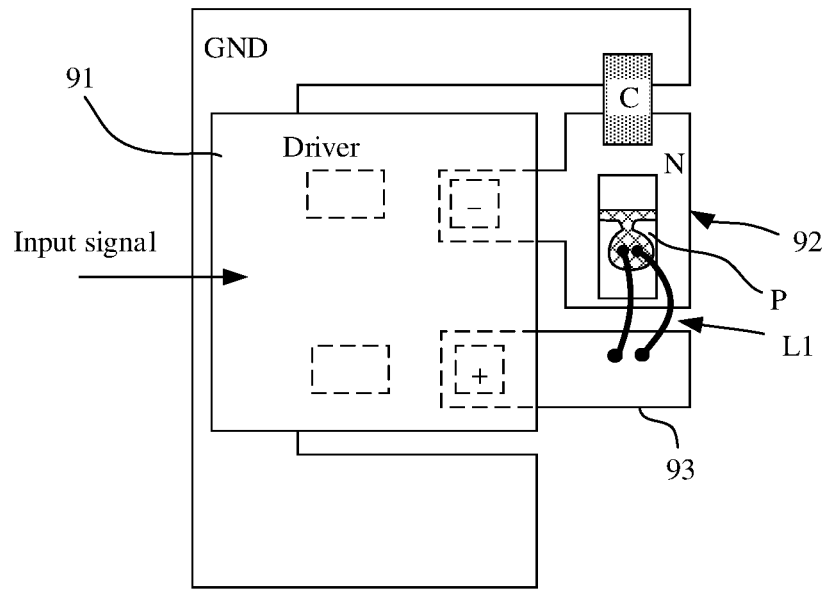
FIG. 10 is a schematic diagram of a package structure of a transmitter circuit according to still another embodiment of this application.

With reference to the transmitter circuit provided in FIG. 3, referring to FIG. 10, a positive electrode (+) of a driver 91 and a ground terminal GND are located on a same side of the driver 91, and the positive electrode (+) of the driver 91 extends to a transition layer 93 outside the driver 91 and is connected to a positive electrode P of a DML 92 through a first bonding wire L1. In this way, because a negative electrode N of the DML directly implements radio frequency grounding through a capacitor C, that is, $I_{mod}$ can be introduced into ground, when a package structure of the transmitter circuit is implemented, wire bonding needs to be performed only on the positive electrode (+) of the driver and the positive electrode P of the DML, thereby reducing impact on an overall package bandwidth and improving overall component bandwidth performance.

A surface mount capacitor C is soldered between the negative electrode N of the DML 92 and the ground terminal GND, thereby avoiding connecting to the capacitor C by wire bonding.

As shown in FIG. 10, when a voltage terminal Vss is the negative electrode (−) of the driver 91, the negative electrode (−) of the driver 91 and the positive electrode (+) of the driver 91 are located on a same side of the driver 91. The negative electrode N of the DML 92 and the negative electrode (−) of the driver 91 are made of a same material, and the negative electrode (−) of the driver 91 is configured to input a predetermined voltage to the negative electrode of the DML.

With reference to the transmitter circuit shown in FIG. 5, when the transmitter circuit includes the first switch K1, in a package structure, the first switch K1 may be included in the driver, and the first switch K1 is connected in series to the positive electrode of the driver 91. When the first switch K1 is turned on, the driver 91 outputs the drive current $I_{driver}$ to the DML 92 through the first switch K1 and the positive electrode (+) of the driver 91.

Figure 11:
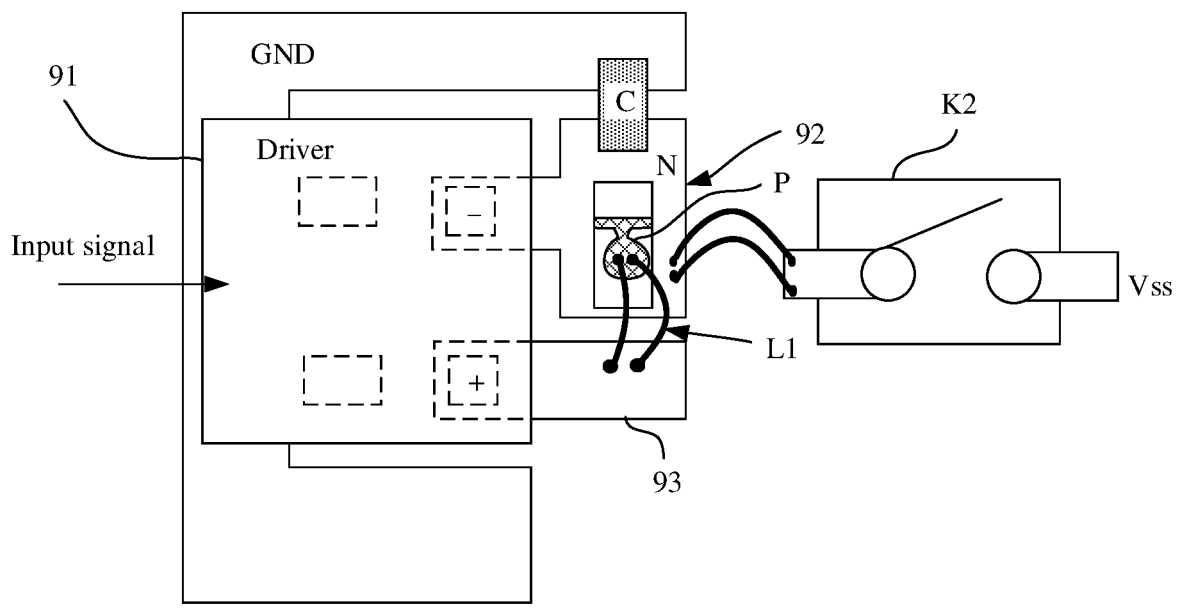
FIG. 11 is a schematic diagram of a package structure of a transmitter circuit according to yet another embodiment of this application.

With reference to the transmitter circuit shown in FIG. 6, when the transmitter circuit includes the second switch K2, as shown in FIG. 11, in a package structure, the second switch K2 is connected in series between the negative electrode N of the DML 92 and the voltage terminal Vss. When the second switch K2 is turned on, the driver 91 outputs the drive current $I_{driver}$ to the DML 92 through the positive electrode (+) of the driver 91. When the voltage terminal Vss is the negative electrode of the driver, the second switch K2 may also be included in the driver.

Although this application is described with reference to specific features and embodiments thereof, it is clear that various modifications and combinations may be made to them without departing from the spirit and scope of this application. Correspondingly, the specification and accompanying drawings are merely example description of this application defined by the accompanying claims, and are considered as any of or all modifications, variations, combinations or equivalents that cover the scope of this application. It is clear that a person skilled in the art can make various modifications and variations to this application without departing from the spirit and scope of this application. This application is intended to cover these modifications and variations of this application provided that they fall within the scope of protection defined by the following claims and their equivalent technologies.

What is claimed is:

1. A transmitter circuit, comprising a driver and a directly modulated laser (DML), wherein
a positive electrode of the driver is connected to a positive electrode of the DML, a negative electrode of the DML is connected to a voltage terminal, and the negative electrode of the DML is connected to a ground terminal through a capacitor;
the driver is configured to generate a drive current based on an input signal, and output the drive current to the DML through the positive electrode of the driver; and
the DML is configured to output a first part of current of the drive current to the ground terminal through the capacitor, and output a second part of current of the drive current to the voltage terminal.

2. The transmitter circuit according to claim 1, wherein the positive electrode of the driver and the ground terminal are respectively located on two sides of the driver, and the positive electrode of the driver is connected to the positive electrode of the DML through a first bonding wire.

3. The transmitter circuit according to claim 1, wherein the positive electrode of the driver and the ground terminal are located on a same side of the driver, and the positive electrode of the driver extends to a transition layer outside the driver and is connected to the positive electrode of the DML through a first bonding wire.

4. The transmitter circuit according to claim 1, wherein the capacitor is a surface mount capacitor, and the surface mount capacitor is soldered between the negative electrode of the DML and the ground terminal.

5. The transmitter circuit according to claim 1, wherein the voltage terminal is connected to an external power supply.

6. The transmitter circuit according to claim 1, wherein the voltage terminal is the negative electrode of the driver.

7. The transmitter circuit according to claim 1, wherein a voltage of the voltage terminal is zero.

8. The transmitter circuit according to claim 7, wherein the positive electrode of the driver is connected in series to the positive electrode of the DML through a first switch.

9. The transmitter circuit according to claim 7, wherein the negative electrode of the DML is connected in series to the voltage terminal through a second switch.

10. An optical module, comprising a transmitter circuit and a receiver circuit, the transmitter circuit comprising a driver and a directly modulated laser (DML), wherein
a positive electrode of the driver is connected to a positive electrode of the DML, a negative electrode of the DML is connected to a voltage terminal, and the negative electrode of the DML is connected to a ground terminal through a capacitor;
the driver is configured to generate a drive current based on an input signal, and output the drive current to the DML through the positive electrode of the driver; and
the DML is configured to output a first part of current of the drive current to the ground terminal through the capacitor, and output a second part of current of the drive current to the voltage terminal.

11. The optical module according to claim 10, wherein the positive electrode of the driver and the ground terminal are respectively located on two sides of the driver, and the positive electrode of the driver is connected to the positive electrode of the DML through a first bonding wire.

12. The optical module according to claim 10, wherein the positive electrode of the driver and the ground terminal are located on a same side of the driver, and the positive electrode of the driver extends to a transition layer outside the driver and is connected to the positive electrode of the DML through a first bonding wire.

13. The optical module according to claim 10, wherein the capacitor is a surface mount capacitor, and the surface mount capacitor is soldered between the negative electrode of the DML and the ground terminal.

14. The optical module according to claim 10, wherein the voltage terminal is connected to an external power supply.

15. The optical module according to claim 10, wherein the voltage terminal is the negative electrode of the driver.

16. The optical module according to claim 10, wherein the positive electrode of the driver is connected in series to the positive electrode of the DML through a first switch.

17. The optical module according to claim 10, wherein the negative electrode of the DML is connected in series to the voltage terminal through a second switch.

18. A package, comprising:
a capacitor;
a driver; and
a directly modulated laser (DML), wherein:
a positive electrode of the driver is connected to a positive electrode of the DML, a negative electrode of the DML is connected to a voltage terminal, the negative electrode of the DML is connected to a ground terminal through the capacitor, and the capacitor is surface mounted to the DML;
the driver is configured to generate a drive current based on an input signal, and output the drive current to the DML through the positive electrode of the driver; and
the DML is configured to output a first part of current of the drive current to the ground terminal through the capacitor, and output a second part of current of the drive current to the voltage terminal.

19. The package according to claim 18, wherein the positive electrode of the driver and the ground terminal are respectively located on two sides of the driver, and the positive electrode of the driver is connected to the positive electrode of the DML through a first bonding wire.

20. The package according to claim 18, wherein the positive electrode of the driver and the ground terminal are located on a same side of the driver, and the positive electrode of the driver extends to a transition layer outside the driver and is connected to the positive electrode of the DML through a first bonding wire.

* * * * *